United States Patent
Bu et al.

(10) Patent No.: US 9,419,409 B2
(45) Date of Patent: Aug. 16, 2016

(54) SINGLE-PUMP MULTI-WAVELENGTH LASING SEMICONDUCTOR RAMAN PUMP LASER AND PUMP COMBINATION APPARATUS

(71) Applicant: Accelink Technologies Co., Ltd., Wuhan (CN)

(72) Inventors: Qinlian Bu, Wuhan (CN); Xiaohui Zou, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 169 days.

(21) Appl. No.: 14/381,749

(22) PCT Filed: Sep. 27, 2012

(86) PCT No.: PCT/CN2012/082134
§ 371 (c)(1),
(2) Date: Aug. 28, 2014

(87) PCT Pub. No.: WO2013/127174
PCT Pub. Date: Sep. 6, 2013

(65) Prior Publication Data
US 2015/0015953 A1   Jan. 15, 2015

(30) Foreign Application Priority Data
Feb. 28, 2012   (CN) .......................... 2012 1 0047801

(51) Int. Cl.
*H01S 3/30* (2006.01)
*H01S 5/068* (2006.01)
(Continued)

(52) U.S. Cl.
CPC .............. *H01S 5/005* (2013.01); *G02B 6/4271* (2013.01); *H01S 3/094096* (2013.01);
(Continued)

(58) Field of Classification Search
CPC ......... H01S 3/302; H01S 5/005; H01S 5/141; H01S 5/146; G02B 27/283
USPC .......................... 359/494.01; 372/3, 6, 43.01
See application file for complete search history.

(56) References Cited

U.S. PATENT DOCUMENTS

| | | | |
|---|---|---|---|
| 6,433,921 B1* | 8/2002 | Wu | ...................... H01S 3/1022 359/334 |
| 6,934,311 B2* | 8/2005 | Shimizu | ................. B82Y 20/00 372/102 |

(Continued)

FOREIGN PATENT DOCUMENTS

| CN | 1623109 A | 6/2005 |
|---|---|---|
| CN | 102593714 A | 7/2012 |

(Continued)

OTHER PUBLICATIONS

International Search Report for Application No. PCT/CN2012/082134 dated Jan. 10, 2013.

(Continued)

*Primary Examiner* — Ricky D Shafer
(74) *Attorney, Agent, or Firm* — Lerner, David, Littenberg, Krumholz & Mentlik, LLP

(57) ABSTRACT

A single-pump multi-wavelength lasing semiconductor Raman pump laser comprises a thermoelectric cooler arranged in a shell; a heat transition bearing platform arranged in the thermoelectric cooler; a semiconductor Raman pump laser tube core arranged on the heat transition bearing platform; and a coupling lens group, a thermistor and a backlight detector that are arranged on the heat transition bearing platform respectively. The pump laser tube core, the backlight detector, the thermistor and the thermoelectric cooler are electrically connected to pins outside a laser tube shell. A pump combination apparatus comprises a first signal transmission fiber, a pump signal combiner and a second signal transmission fiber that are sequentially connected to each other. An input terminal of the pump signal combiner is connected to an output terminal of an isolated polarization beam combiner and depolarizer. Two polarization maintaining fiber input terminals of the isolated polarization beam combiner and depolarizer are correspondingly connected to one single pump multi-wavelength lasing semiconductor Raman pump laser respectively.

9 Claims, 4 Drawing Sheets

(51) Int. Cl.
*H01S 5/24* (2006.01)
*G02B 27/28* (2006.01)
*H01S 5/00* (2006.01)
*H01S 5/024* (2006.01)
*H01S 5/10* (2006.01)
*H01S 5/14* (2006.01)
*H01S 3/094* (2006.01)
*H01S 5/022* (2006.01)
*G02B 6/27* (2006.01)
*G02B 6/42* (2006.01)
*H01S 3/067* (2006.01)

(52) U.S. Cl.
CPC .......... *H01S 5/02415* (2013.01); *H01S 5/1092* (2013.01); *H01S 5/146* (2013.01); *G02B 6/2773* (2013.01); *G02B 6/4218* (2013.01); *G02B 6/4285* (2013.01); *G02B 6/4296* (2013.01); *G02B 27/283* (2013.01); *H01S 3/06766* (2013.01); *H01S 3/302* (2013.01); *H01S 5/02216* (2013.01); *H01S 2301/04* (2013.01)

(56) References Cited

U.S. PATENT DOCUMENTS

| | | | | |
|---|---|---|---|---|
| 6,950,452 | B2* | 9/2005 | Tsukiji | G02B 6/4201 372/101 |
| 2002/0075913 | A1 | 6/2002 | Koyanagi | |
| 2002/0093738 | A1* | 7/2002 | Kimura | H01S 5/02248 359/489.05 |
| 2002/0118715 | A1 | 8/2002 | Kimura et al. | |
| 2002/0154665 | A1* | 10/2002 | Funabashi | H01S 5/125 372/45.01 |
| 2003/0068125 | A1 | 4/2003 | Yoshida et al. | |
| 2003/0072342 | A1* | 4/2003 | Yoshida | B82Y 20/00 372/46.01 |
| 2003/0091300 | A1* | 5/2003 | Irino | G02B 6/124 385/88 |
| 2006/0109875 | A1* | 5/2006 | Matsushita | H01S 5/146 372/29.02 |
| 2006/0176922 | A1* | 8/2006 | Ohki | H01S 5/146 372/43.01 |

FOREIGN PATENT DOCUMENTS

| | | |
|---|---|---|
| GB | 2380313 A | 4/2003 |
| JP | 2006108426 A | 4/2006 |
| JP | 2009059938 A | 3/2009 |

OTHER PUBLICATIONS

Yin, Xinda et al., Novel Design of Raman Amplifier Pump Module, Proceedings of SPIE, vol. 5280 (SPIE, Bellingham, WA, 2004), pp. 352-357.

Zheng-mao et al., "Theoretical Model on Multi-Wavelength Output of a Fiber Grating External Cavity Semiconductor Laser", Journal of Southwest China Normal University (Natural Science), vol. 28, No. 3, Jun. 2003, English translation of Abstract only.

* cited by examiner

SINGLE-PUMP MULTI-WAVELENGTH LASING SEMICONDUCTOR RAMAN PUMP LASER AND PUMP COMBINATION APPARATUS

CROSS-REFERENCE TO RELATED APPLICATIONS

The present application is a national phase entry under 35 U.S.C §371 of International Application No. PCT/CN2012/082134, filed Sep. 27, 2012, which claims priority to Chinese Application No. 201210047801.4, filed Feb. 28, 2012, all of which are hereby incorporated herein by reference.

BACKGROUND

According to the invention hereof, there is provided a semiconductor pump laser, particularly a single pump multi-wavelength lasing semiconductor Raman pump laser and pump combination apparatus applied to Raman optical fiber amplifier (hereinafter referred to as OFA).

With the development of optical fiber communication technology and its use, Raman OFA has a more extensive application in optical fiber communication system. The Raman OFA could amplify the signal with transmission wavelength via various transmission optical fiber as long as the pumping wavelength and power are properly set. plurality of the wavelength amplification window could be easily extended when plurality of pumping wavelengths are combined.

As for the Raman amplifier adopted in the DWDM (Dense Wavelength Division Multiplexing) system at present, it is the common practice that the Raman gain bandwidth (GB) is widened by using a multi-wavelength pumping source to combine waves, and gain spectrum is flatten by setting number and interval and power of pumping wavelengths. The current Raman pump laser for optical fiber communication adopts mature semi-conductor laser with multiple quantum well (MQW) structure in the InGaAsP multi-material system. For endurable reliability and other considerations, the laser die with different reflectances on the front and back surfaces is mounted in a hermetic sealing shell with standard 14-pin butterfly-shape packaging. Between the shell and laser die is a semi-conductor TEC (Thermoelectric Cooler) to maintain temperature of the laser die and a heat transfer plummer to carry the laser die, coupling lens, thermistor and backlight monitoring detector. Since the Raman gain frequency shift is constant with respect to the output frequency of the pump laser, the output pump wavelength of the Raman pump laser should be stable enough to ensure a stable gain of the transmission signal. However, the output pump wavelength of the pump laser die will shift with the temperature, working current and so on, therefore the TEC to stabilize the die temperature and the FBG (fiber Bragg Grating) on the laser pigtail to lock the pump wavelength are indispensable. FBG is generally etched on the pigtail outside the laser package, and uses a reflected light reflecting to the laser diode with narrow wavelength range to realize wavelength locking.

Currently, the pump laser for Raman amplification uses a FBG to realize single pump wavelength locking, i.e. the stable output of a single pump and single pump wavelength. In Raman amplifier in the DWDM system, it usually plurality of realizes flat gain of the amplifier by combining waves of plurality of such pump lasers with different output pump wavelengths. To meet requirement to gains of each channels of the system without using a gain flatten filter, it requires at least 3 different pump wavelengths to realize flat gain in C band. In real practice that Raman amplifier is often used to improve SNR (signal to noise ratio), no large gain or pump power would be necessary. Nevertheless, plurality of pump lasers with different pump wavelengths or GFF are often adopted to get flat Raman gain. The use of plurality of pump lasers or GFF will lead to increased power consumption and cost of the amplifier, such as the procurement cost of plurality of pumps, the power consumption in the process of respective pump temperature control, and the loss of stabilized energy with GFF which asks for higher-power pumps and increased cost.

As in FIG. 5 illustrating a Raman pump combination method in the Patent (the IPBCD and Raman pump combination patent by Accelink), 3-1 and 3-2 are signal transmission fibers in the optical fiber communication link, 7-1, 7-2, 7-3 and 7-4 are four Raman pump lasers with different transmission wavelengths. Every 2 of the 4 lasers would be connected to 2 input polarizing-maintaining pigtails of the IPBCDs 6-1 and 6-2 in the mode of slow axis alignment or fast axis alignment. Besides, the output pigtails of two IPBCDs would be connected to the transmission and refection ends of the pump combination WDM 5, and the common end of pump combination WDM 5 is connected to the input end of pump signal combination WDM 4. Furthermore, other 2 ends of pump signal combination WDM 4 are connected respectively with transmission fiber 3-2 on the input end and transmission fiber 3-1 on the output end. As this patent adopted 4 Raman pump lasers with different pump wavelengths, it would increase system power consumption and cost.

SUMMARY

The object of this invention is to overcome the existing technological deficiency by providing a single pump multi-pump wavelength semi-conductor Raman pump laser and pump combination apparatus thereof, which use at least 2 FBGs with different central pump wavelengths on the output pigtail of the pump laser to make Raman gains correspond to multi pump wavelengths lasing flat.

An embodiment of this invention provided a single pump multi-wavelength lasing semi-conductor Raman pump laser and pump combination apparatus thereof. The single pump multi-pump wavelength lasing semi-conductor Raman pump laser comprises a semi-conductor Raman pump laser packaging module, a output pigtail of the semi-conductor Raman pump laser packaging module, and plurality of fiber Bragg gratings (FBG) on the output pigtail. The semiconductor Raman pump laser packing module comprises a shell, a semi-conductor thermoelectric cooler (TEC) inside the shell, a heat transfer plummer inside the semiconductor thermoelectric cooler, a semiconductor Raman pump laser die on the heat transfer plummer, coupling lens, a thermistor and a backlight detector set around the semiconductor Raman pump laser die on the heat transfer plummer. The pins of the semiconductor pump laser die, the backlight detector, the thermistor and the semiconductor thermoelectric cooler are electrically connected with pins outside shell of laser tube.

The minimum distance between the first stage fiber-optical Bragg grating and the semiconductor Raman pump laser die is greater than the coherence length of the intrinsic output of the laser.

There are at least 2 reflectance spectrum central pump wavelengths of the plurality of fiber-optical Bragg gratings on the output pigtail, and the space between central pump wavelengths of 2 adjacent reflectance spectrums is greater than 5 nm.

The reflectance coefficients of reflectance spectrum of the plurality of fiber-optical Bragg gratings on the output pigtail of the laser are same or different.

The difference between the reflectance wavelength of the every fiber-optical Bragg grating and the intrinsic output wavelength within full operating current and temperature range is not greater than the lock-losing limit.

A single pump multi-wavelength lasing semi-conductor Raman pump laser comprises sequentially connected 1st signal transmission optical fiber, a pump signal combiner and a 2nd signal transmission optical fiber. The input end of the pump signal combiner is connected with the output end of an isolated polarization beam combiner depolarizer (IPBCD). 2 polarizing maintaining optical fiber input ends of the isolated polarization beam combiner depolarizer are respectively connected with a semi-conductor Raman pump laser.

The 2 polarizing maintaining optical fiber input ends of the isolated polarization beam combiner depolarizer is respectively connected to a semi-conductor Raman pump laser with single pump and multi pump wavelengths lasing in away of slow axis alignment or fast axis alignment.

A pump combination apparatus adopting a single pump with multi pump wavelengths lasing semi-conductor Raman pump laser comprises sequentially connected 1st signal transmission optical fiber, a pump signal combiner and a 2nd signal transmission optical fiber. The input end of the pump signal combiner is connected with the output end of the isolated depolarizer. The polarizing maintaining optical fiber input end of the isolated depolarizer is connected with a single pump with multi pump wavelength lasing semi-conductor Raman pump laser.

The polarizing maintaining optical fiber input end of the isolated depolarizer is connected with a single pump with multi pump wavelength lasing semi-conductor Raman pump laser in the way of slow axis alignment or fast axis alignment.

The single pump multi pump wavelengths lasing semi-conductor Raman pump laser is applied in Raman amplification to realize a flat Raman gain spectrum, reduce number of pumps, simplify the control circuit and software, increase usage of pumping power, reduce the size of amplifier, and lower the manufacturing and operating cost of the amplifier. The advantages are as follows:

1. Compared with common Raman amplifier, with the Raman amplifier of embodiments of this invention number of pump lasers is reduced, transmission efficiency of the pumps incoming signal transmission fiber is higher, pumping power in the same gain condition is lower, energy transfer efficiency is higher, and amplifier size is smaller.

2. In embodiments of this invention, the structure of the light path is simple and easy to implement, cost can be decreased while improving product performance.

3. In embodiments of this invention, it is easy to be controlled under medium and small gain, which could effectively simplify the control circuit and software.

Figure 1:
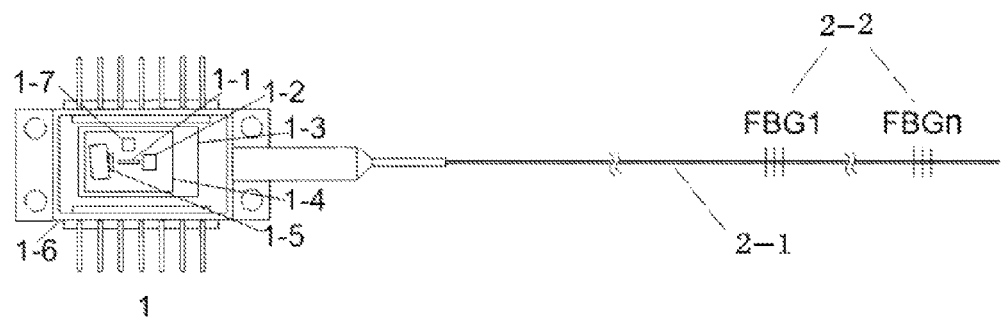
FIG. 1 shows structure of a single pump with multi pump wavelengths lasing semi-conductor Raman pump laser in an embodiment of this invention.
Figure 2:
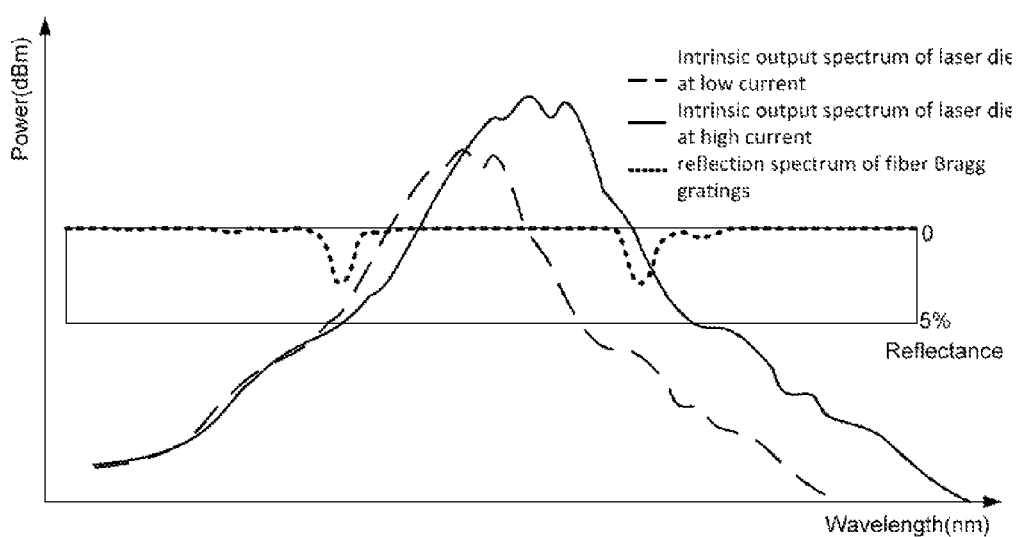
FIG. 2 shows Intrinsic Gain Spectrum and FBG Reflectance of Dual pump wavelengths on the opposite side of the pump laser.
Figure 3:
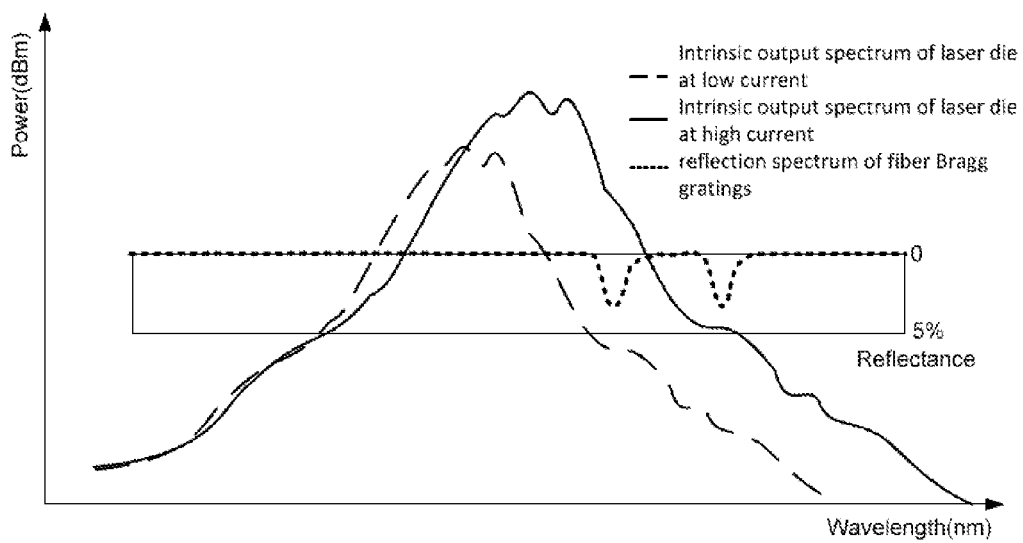
FIG. 3 shows Intrinsic Gain Spectrum and FBG Reflectance of Dual pump wavelengths on the same side of the pump laser.
Figure 4:
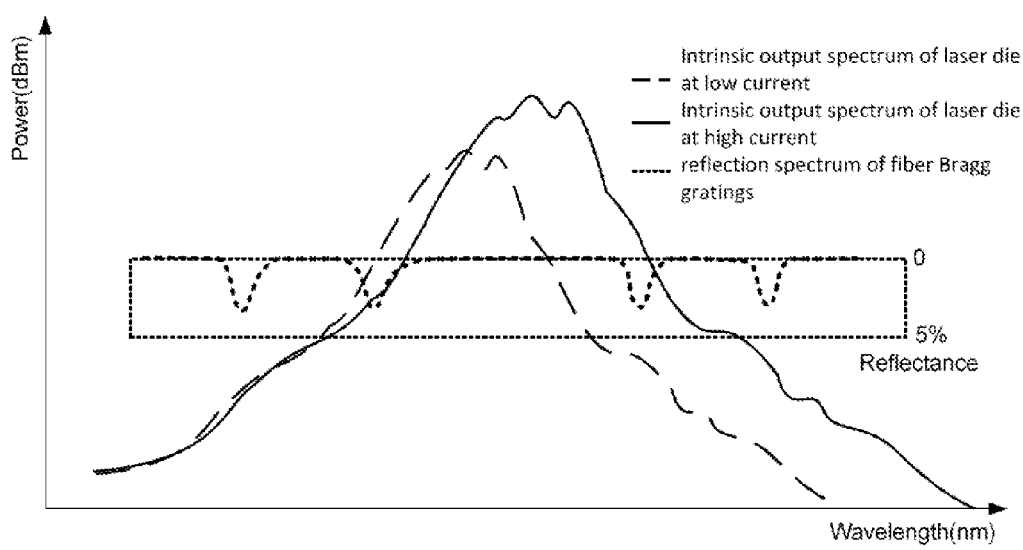
FIG. 4 shows Intrinsic Gain Spectrum and four pump wavelengths FBG Reflectance of the pump laser.

In the drawings:
1: semi-conductor Raman pump laser packaging module
1-1: semi-conductor Raman pump laser die
1-2: coupling lens
1-3: semiconductor thermoelectric cooler (TEC)
1-4: heat transfer plummer
1-5: backlight detector
1-6: laser packaging shell
1-7: thermistor
2-1: output pigtail
2-2: fiber Bragg grating (FBG)
3-1: 2nd signal transmission fiber
3-2: 1st signal transmission fiber
4: pump signal combination apparatus
5: pump combiner
6-1: IPBCD
6-2: IPBCD
7-1, 7-2, 7-3, 7-4: single pump wavelength output Raman pumping laser
6: IPBCD
7-5: semi-conductor Raman pump laser with single pump and multi pump wavelengths lasing
7-6: semi-conductor Raman pump laser with single pump and multi pump wavelengths lasing
8: isolated depolarizer (ID)
7-7: semi-conductor Raman pump laser with single pump and multi pump wavelengths lasing

DETAILED DESCRIPTION

With embodiment and drawings, this part is a detailed description about the semi-conductor Raman pump laser with single pump and multi pump wavelengths lasing and pump combination apparatus in this invention.

As FIG. 1, the semi-conductor Raman pump laser with single pump and multi pump wavelengths lasing comprises a semiconductor Raman pump laser packing module (1), an output pigtail (2-1) of the semiconductor Raman pump laser packing module (1), and plurality of fiber-optical Bragg gratings (FBG) (2-2) on the output pigtail (2-1). The semiconductor Raman pump laser packing module (1) comprises a shell (1-6), a semiconductor thermoelectric cooler (TEC) (1-3) inside the shell (1-6), a heat transfer plummer (1-4) set inside the semiconductor thermoelectric cooler (TEC) (1-3), a semiconductor Raman pump laser die (1-1) on the center of the heat transfer plummer (1-4), coupling lens (1-2), a thermistor (1-7) and a backlight detector (1-5) around the semiconductor Raman pump laser die (1-1) on the heat transfer plummer (1-4). The pump laser die (1-1), coupling lens (1-2), backlight detector (1-5), thermistor (1-7) are fixed on the heat transfer plummer (1-4). The heat transfer plummer (1-4) is fixed to the TEC (1-3) by tin soldering and so on. The TEC (1-3) is connected and fixed to the packaging shell (1-6) by tin soldering. The semiconductor Raman pump laser die (1-1), backlight detector (1-5), thermistor (1-7) and semiconductor thermoelectric cooler (1-3) are electrically connected with pins outside shell (1-6) of laser tube. The pump laser die (1-1), backlight detector (1-5), thermistor (1-7) and TEC (1-3) are electrically connected with the pin of shell (1-6) of laser tube in the way of patterned electrode or gold wire bonding or wire connection. The output pigtail (2-1) and plurality of fiber Bragg gratings (FBG) (2-2) thereon with different reflection center wavelengths are precisely coupled to the light beam output from the laser die and fixed, in the tail pipe of the packaging module (1) of the semi-conductor Raman pump laser. The plurality of FBGs can be made on the same one pigtail (2-1), or plurality of with FBG made on pigtails (2-1) are welded in the way of slow or fast axis alignment. To avoid interference from the FBG reflectance, the minimum space between the laser die and the FBGs is required to be greater than the coherence length of the laser's intrinsic output.

That is, based on the characteristics of semi-conductor Raman pump laser, the position, reflection wavelength, reflectance and reflection spectrum shape of different FBGs, which are on the output pigtail of the semi-conductor Raman pump laser and reflect plurality of different wavelengths, should be set to reach the expected laser output under different working conditions. As for output pigtail (2-1), to avoid interference (which may influence stability of output) by the light reflected from FBG and the light within laser shell (1-6), the minimum distance between the first stage fiber-optical Bragg grating (2-2) and the semiconductor Raman pump laser die (1-1) is greater than the coherence length of the intrinsic output of the laser. As for FBG (2-2), to realize similar output power of different wavelengths on desired working points, it is necessary to keep FBG reflection wavelength corresponding to similar level of the laser intrinsic gain spectrum, or to make FBG reflectance corresponding to the lower intrinsic gain position higher.

Therefore, there are at least 2 reflectance spectrum central wavelengths of the plurality of fiber-optical Bragg gratings (2-2) on the output pigtail (2-1) of the laser, and the interval between 2 adjacent reflectance spectrum central wavelengths is greater than 5 nm. The reflectance coefficients of reflectance spectrum of the plurality of fiber-optical Bragg gratings (2-2) on the output pigtail of the laser are same or different. The space between any of FBGs (2-2) on the output pigtail (2-1) of the laser of the laser and the semi-conductor Raman pump laser die (1-1) is greater than 600 mm.

The difference between the reflectance wavelength of each of the fiber-optical Bragg grating (2-2) and the intrinsic output wavelength of the laser within full operating current range is not greater than the lock-losing limit. If the difference is greater than the limit, it may happen that final output light spectrum peak of the laser does not coincide with the FBG reflection peak wavelength, which will cause instability of output.

Generally speaking, wavelength change with drive current may reach 11.5 nm/A and wavelength change rate along with temperature may reach 0.3 nm/° C., since output spectrum of the semi-conductor Raman pump laser with single pump and multi pump wavelengths lasing without wavelength locking by FBG may change rapidly with changes of drive current and die temperature. Due to TEC, laser die temperature within operating range could remain within about 5° C. Thus, generally, the influence of drive current change on laser intrinsic output spectrum and output pump wavelength will be taken into condition as for FBG reflectance and reflection wavelength. The drive current of Raman pump laser could be up to 2 A, which means that the laser intrinsic wavelength change may reach about 23 nm in full operation current range. To ensure FBG could realize laser output wavelength locking within full operating current range, the difference between reflection wavelength of each FBG and laser intrinsic output wavelength within full operating current range could not greater than the lock-losing limit, which is decided by the shape and width of the laser intrinsic output spectrum and reflectance of FBG. Meanwhile, to avoid mode hopping or single mode operation of the semi-conductor Raman pump laser with single pump and multi pump wavelengths lasing, reflection spectrum width of the FBG and longitudinal mode interval of the laser intrinsic output spectrum should be carefully optimized and balanced. At any time, the overlapping part of laser intrinsic output spectrum and FBG reflection spectrum must include plurality of longitudinal modes, which could be realized by designing longer laser die with a laser cavity length more than 800 um, or properly broaden bandwidth of the FBG reflection spectrum. The FBG reflectance and coating reflectance on the front and back end sides of laser die should also be carefully balanced. The higher is the FBG reflectance, the better is the pump wavelength locking capacity. However, it will also reduce kink current of the laser and then reduce maximum power output of the laser. On the contrary, lower FBG reflectance may cause lager maximum power output, but also raise threshold current (Ith) and degrade pump wavelength locking capacity. The coating on the front end side of laser die with a higher reflectance will cause higher one way intra-cavity gain, but the final output power will be lower and cause severe fluctuation of longitude modes and unstable mode after FBG locking pump wavelength. Reduction of the coating reflectance on the front end side of laser die could increase output power, but also higher threshold current. Through the above comprehensive consideration, the finally applicable Raman pump laser has the following parameters. The back end side coating of laser die has a reflectance above 97%, while that of the front end side coating of laser die is about 1%. The minimum space between die and FBGs is above 600 mm. Reflectance of each FBG should be optimized according to the relative amplitude of the laser die intrinsic gain spectrum corresponding to the reflection wavelength. If every pump wavelength of the final pump laser output needs to be same, the FBG corresponding to the pump wavelength with lower intrinsic spectrum should have higher reflectance, while the FBG corresponding to the pump wavelength with higher intrinsic spectrum should have lower reflectance. In practical use in which all parameters are set, final output powers of each pump wavelength could be refined by changing the laser die temperature.

The Raman pump laser, which comprises a semiconductor Raman pump laser packing module (1), an output pigtail (2-1) of the semiconductor Raman pump laser packing module (1), and plurality of fiber-optical Bragg gratings (2-2) on the output pigtail (2-1), realizes flat Raman amplification of required pump light output through isolation, depolarization and wave combining. If the output of 3 or 4 pump wavelengths could realize flat amplification of all signals by single semi-conductor Raman pump laser, it is necessary to connect the semi-conductor Raman pump laser and the isolated depolarizer (ID) then connect them with the pump/signal combiner (WDM). If the output of 2 or more pump wavelengths cannot realize the flat amplification of all signals by single semi-conductor Raman pump laser, it is necessary to use an isolated polarization beam combiner & depolarizer (IPBCD) to conduct orthogonal beam combining of 2 polarizing pump lights carrying plurality of pump wavelengths, isolation and depolarization then connect them with the combination apparatus WDM. The depolarization could be realized through a Lyot-type depolarizer welded by 2 polarization-maintaining fibers with length ratio of 1:2 at a 45 degree angle, or a depolarizer based on birefringent crystal. The polarizing beam combination could be realized through a polarization-maintaining coupler formed from tapered polarization-maintaining fiber, or a polarizing beam combining prism constructed from coating or birefringent crystal.

Through control on temperature of the pump laser die, this invention could realize power adjustment of different pump wavelengths. Also, the change of working current of the pump laser could also lead to change of power ratio of different pump wavelengths.

To realize a maximum gain of 10 dB by using plurality of pumps, we could adjust the pump at the maximum gain to realize flat gain. In other cases, we could merely lower the pumping working currents synchronously in equal proportion so as to realize flat gain.

Figure 6:
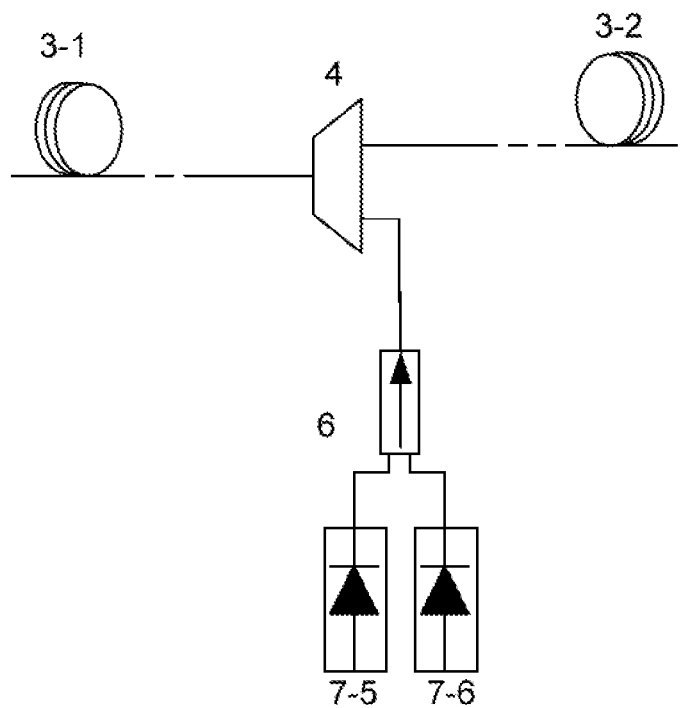
FIG. 6 shows 1st Embodiment of the pump combination structure based on a semi-conductor Raman pump laser with single pump and multi pump wavelengths lasing.

As shown in FIG. 6, the pump combination apparatus of semi-conductor Raman pump laser with the single pump and multi pump wavelengths lasing comprises sequentially connected 1st signal transmission optical fiber (3-2), a pump signal combiner (4) and a 2nd signal transmission optical fiber (3-1). The input end of the pump signal combiner (4) is connected with the output end of an isolated polarization beam combiner depolarizer (6). The 2 polarizing maintaining optical fiber input ends of the isolated polarization beam combiner depolarizer (6) are respectively connected with a semi-conductor Raman pump laser (7-5, 7-6). The number of output pump wavelengths of each semi-conductor Raman pump laser (7-5, 7-6) is no less than 2.

The 2 polarizing maintaining optical fibers of the isolated polarization beam combiner depolarizer (6) is respectively connected to a single pump with multipump wavelengths lasing semi-conductor Raman pump laser (7-5, 7-6) in the way of slow axis alignment or fast axis alignment.

Figure 5:
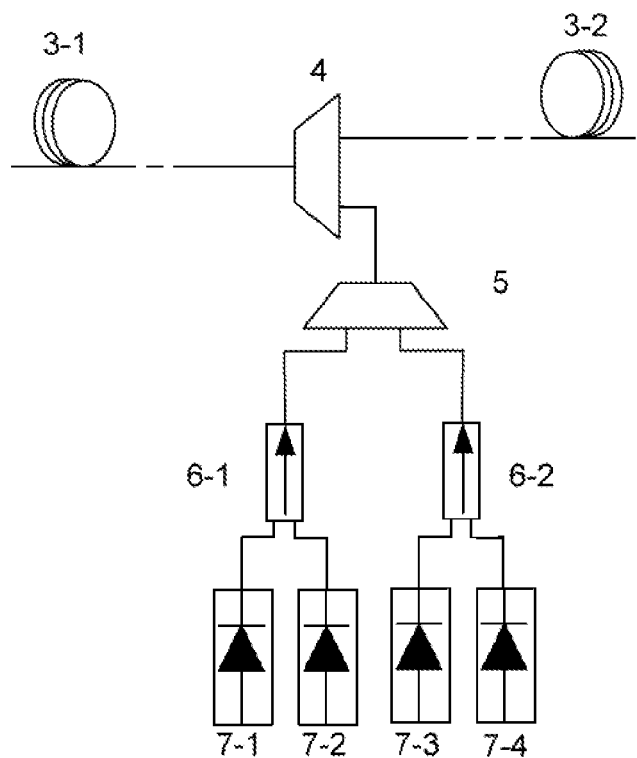
FIG. 5 shows pump combination structure Based on common Raman pump laser.

Compared with the pump combination apparatus in FIG. 5, with the pump combination apparatus in FIG. 6, it saves two pump laser pump lasers (7), an IPBCD (6) and a pump signal combiner (5). The loss of pump light power from laser to the signal transmission fiber on input end could be reduced from 1.4 dB to 1 dB. If the pump power into signal transmission fiber is constant, the pump combination apparatus could save 7% of pump power.

Figure 7:
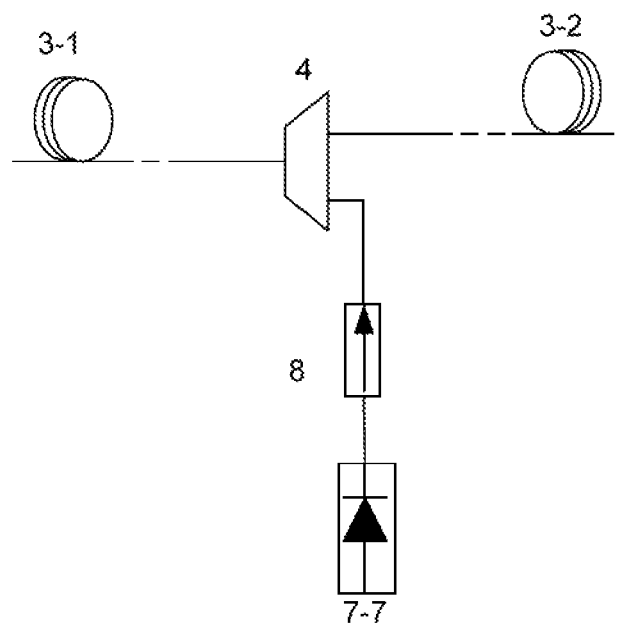
FIG. 7 shows 2nd Embodiment of the pump combination structure based on a semi-conductor Raman pump laser with single pump and multi pump wavelengths lasing.

As in FIG. 7, the pump combination apparatus of the semi-conductor Raman pump laser with single pump and multi pump wavelengths lasing can comprise sequentially connected 1st signal transmission optical fiber (3-2), a pump signal combiner (4) and a 2nd signal transmission optical fiber (3-1). The input end of the pump signal combiner (4) is connected with the output end of an isolated polarization beam combiner depolarizer (8). The polarization maintaining fiber input end of the isolated depolarizer (8) is connected with a semi-conductor Raman pump laser with single pump and multi pump wavelengths lasing (7-7), with 2 or more output pump wavelengths.

The polarization maintaining fiber input end of the isolated depolarizer (8) is connected with a semi-conductor Raman pump laser with single pump and multi pump wavelengths lasing (7-7) in the way of slow axis alignment or fast axis alignment.

Compared with the pump combination apparatus in FIG. 5, with the pump combination apparatus in FIG. 7, it saves 3 pump lasers (7), 2 IPBCD (6) and a pump signal combiner (5). The loss of pump light power from laser to the signal transmission fiber on input end could be reduced from 1.4 dB to 1 dB. If the pumping power into signal transmission fiber is constant, the pump combination apparatus could save 10% of pump power.

Although a specified embodiment to which the present invention is applied is described in detail for reference, it is to be noted that, for technologists in this filed, this invention can be arbitrarily modified in both form and details without departing from the spirit and scope thereof, and the modification(s) will fall within the scope of protection of the invention stated herein.

What is claimed is:

1. A single pump multi-wavelength lasing semi-conductor Raman pump laser comprising a semiconductor Raman pump laser packing module, an output pigtail of the semiconductor Raman pump laser packing module, and a plurality of fiber-optical Bragg gratings set on the output pigtail,
    wherein the semiconductor Raman pump laser packing module comprises:
    a shell; a semiconductor thermoelectric cooler inside the shell; a heat transfer plummer set inside the semiconductor thermoelectric cooler; a semiconductor Raman pump laser die set on the heat transfer plummer; coupling lens, a thermistor and a backlight detector set on the heat transfer plummer and around the semiconductor Raman pump laser die, respectively,
    wherein the semiconductor Raman pump laser die, backlight detector, thermistor and semiconductor thermoelectric cooler are electrically connected with pins outside shell of the laser.

2. The single pump multi-wavelength lasing semi-conductor Raman pump laser in claim 1, wherein a minimum distance between a first stage of the plurality of fiber Bragg grating and the semiconductor Raman pump laser die is greater than a coherence length of an intrinsic output of the laser.

3. The single pump multi-wavelength lasing semi-conductor Raman pump laser in claim 1, wherein there are at least two reflectance spectrum central pump wavelengths of the plurality of fiber Bragg gratings on the output pigtail of the laser, and the interval between two adjacent reflectance spectrum central pump wavelengths is greater than 5 nm.

4. The single pump multi-wavelength lasing semi-conductor Raman pump laser in claim 1, wherein Reflectance coefficients of reflectance spectrum of the plurality of fiber Bragg gratings on the output pigtail of the laser are same or different.

5. The single pump multi-wavelength lasing semi-conductor Raman pump laser in claim 1, wherein a difference between the reflectance wavelength of each of the fiber Bragg gratings and an intrinsic output wavelength of the laser within full operating current range and full operating temperature range is smaller than or equal to lock-losing limit.

6. A pump combination apparatus adopting the single pump multi-wavelength lasing semi-conductor Raman pump laser in claim 1, further comprising sequentially connected a 1st signal transmission optical fiber, a pump signal combiner and a 2nd signal transmission optical fiber,
    wherein an input end of the pump signal combiner is connected with an output end of an isolated polarization beam combiner depolarizer, and two polarizing maintaining optical fiber input ends of the isolated polarization beam combiner depolarizer are respectively connected with a single pump multi-wavelength lasing semi-conductor Raman pump laser.

7. The pump signal combiner adopting the single pump multi-wavelength lasing semi-conductor Raman pump laser in claim 6, wherein the two polarizing maintaining optical fiber input ends of the isolated polarization beam combiner depolarizer are respectively connected with a single pump multi-wavelength lasing semi-conductor Raman pump laser in a manner of slow axis alignment or fast axis alignment.

8. A pump combination apparatus adopting the single pump multi-wavelength lasing semi-conductor Raman pump laser in claim 1, further comprising sequentially connected a 1st signal transmission optical fiber, a pump signal combiner and a 2nd signal transmission optical fiber,
wherein an input end of the pump signal combiner is connected with an output end of an isolated depolarizer, a polarizing maintaining optical fiber input end of the isolated depolarizer is connected with a single pump multi-wavelength lasing semi-conductor Raman pump laser.

9. The pump signal combiner adopting the single pump multi-wavelength lasing semi-conductor Raman pump laser in claim 8, wherein the polarizing maintaining optical fiber input end of the isolated depolarizer is connected with the single pump multi-wavelength lasing semi-conductor Raman pump laser in a manner of slow axis alignment or fast axis alignment.

* * * * *